(12) United States Patent
Grabbe

(10) Patent No.: US 7,029,292 B2
(45) Date of Patent: Apr. 18, 2006

(54) ELECTRICAL CONNECTOR AND CONTACT

(75) Inventor: Dimitry G. Grabbe, Middletown, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/016,405

(22) Filed: Dec. 16, 2004

(65) Prior Publication Data

US 2005/0130464 A1    Jun. 16, 2005

Related U.S. Application Data

(60) Provisional application No. 60/530,350, filed on Dec. 16, 2003.

(51) Int. Cl.
   *H01R 12/00*    (2006.01)
(52) U.S. Cl. ........................................ 439/83
(58) Field of Classification Search .................. 439/83, 439/876
   See application file for complete search history.

(56) References Cited

U.S. PATENT DOCUMENTS

| | | | | |
|---|---|---|---|---|
| 5,909,011 | A * | 6/1999 | Chartrand et al. | 174/261 |
| 5,984,694 | A * | 11/1999 | Sinclair | 439/70 |
| 5,997,317 | A * | 12/1999 | Pei et al. | 439/83 |
| 6,116,923 | A * | 9/2000 | Szu | 439/83 |
| 6,155,845 | A * | 12/2000 | Lin et al. | 439/83 |
| 6,217,348 | B1 * | 4/2001 | Lin et al. | 439/83 |
| 6,352,437 | B1 * | 3/2002 | Tate | 439/83 |
| 6,371,784 | B1 * | 4/2002 | Scholz et al. | 439/342 |
| 6,485,313 | B1 * | 11/2002 | Lu et al. | 439/83 |
| 6,494,725 | B1 * | 12/2002 | Lin et al. | 439/83 |
| 6,501,665 | B1 * | 12/2002 | Ted | 361/808 |
| 6,533,591 | B1 * | 3/2003 | Lee | 439/83 |
| 6,561,831 | B1 * | 5/2003 | McHugh et al. | 439/342 |
| 6,565,368 | B1 * | 5/2003 | Liao et al. | 439/83 |
| 6,623,283 | B1 * | 9/2003 | Torigian et al. | 439/83 |
| 6,641,410 | B1 * | 11/2003 | Marvin et al. | 439/83 |
| 6,692,265 | B1 * | 2/2004 | Kung et al. | 439/68 |
| 6,702,594 | B1 * | 3/2004 | Lee et al. | 439/83 |
| 6,783,375 | B1 * | 8/2004 | He | 439/83 |
| 6,884,088 | B1 * | 4/2005 | Kajinuma et al. | 439/70 |
| 2002/0187688 | A1 * | 12/2002 | Marvin et al. | 439/862 |
| 2003/0013330 | A1 * | 1/2003 | Takeuchi | 439/83 |
| 2003/0068916 | A1 * | 4/2003 | Ju | 439/342 |
| 2003/0114028 | A1 * | 6/2003 | Ohkita et al. | 439/83 |
| 2003/0114029 | A1 * | 6/2003 | Lee et al. | 439/83 |
| 2003/0186571 | A1 * | 10/2003 | Lin | 439/83 |
| 2003/0203660 | A1 * | 10/2003 | Kassa et al. | 439/65 |
| 2005/0059276 | A1 * | 3/2005 | Lee et al. | 439/83 |

\* cited by examiner

*Primary Examiner*—Ross Gushi
(74) *Attorney, Agent, or Firm*—Wei Te Chung

(57) ABSTRACT

Disclosed is an electrical connector having an insulative housing and conductive connector wherein conductive connector has a distal end which is angled and generally rectangular in shape with the four corners of the rectangular shape of the distal end bent to receive a fusible material. The fusible material will generally be a solder ball. Also disclosed is a product made by the process of bending the rectangular shape of the distal end of the contact so as to receive a solder ball.

12 Claims, 3 Drawing Sheets

ELECTRICAL CONNECTOR AND CONTACT

1. CROSS-REFERENCE TO RELATED APPLICATIONS

This application is a continuation of Provisional Application No. 60/530,350 filed Dec. 16, 2003.

2. BACKGROUND OF THE INVENTION

The field of endeavor of this electrical connector and contact is, generally, Class 439, Sub-class 83, relating to contacts to be soldered to a printed circuit board. The invention relates to the positioning of a solder ball on the contact platform or pad.

The materials set forth in connection with this U.S. patent application describe an electrical connector and associated contact—see, e.g., U.S. Pat. Nos. 5,997,317, 6,095,842, 6,099,321, 6,113,411, 6,113,412, 6,116,922, 6,116,923, 6,132,222, 6,142,810, 6,142,811, 6,171,156, 6,213,807 and 6,267,615, which are all hereby incorporated by reference. Further description of this invention is set forth below and in the attached drawings (FIGS. 1–3).

3. BRIEF SUMMARY OF THE INVENTION

This invention relates to a new, economical connector platform or pad which provides for positioning a solder ball on a contact without using a deformation in the housing of the connector for positioning the solder ball and without using a "dimple" on the platform or pad of the contact for positioning the solder ball.

4. BRIEF DESCRIPTION OF THE DRAWINGS

DETAILED DESCRIPTION OF THE INVENTION

The present invention pertains primarily to Ball Grid Array ("BGA") connectors, although it has other electrical/connector related applications. Ball Grid Array is presently becoming the dominant means of connecting sockets and all kinds of connectors to the Printed Circuit Boards. One of the important manufacturing steps is the attachment of the solder ball to the contact. The standard procedure is to either apply solder past, or flux, to the surface of the pad or platform to which the ball is to be attached.

If the ball is made of 60-40 alloy, it is melted onto the pad directly. Some contacts are made of some copper alloy, over-plated with Nickel. Nickel is usually covered by a film, which is some form of "oxide." The composition of this film varies according to the environment to which Nickel was exposed, when first plated. When such film is present, it is "PASSIVE", i.e., it is not solderable using flux of the type which is acceptable for soldering components to the circuit boards (PCB). However, an extra "active" flux renders passive Nickel solderable. Be that as it may, the solder ball needs to be positioned (oriented) on the center of the Pad, or Platform on the contact. Other BGA connectors use the geometry of the housing hole to receive the solder paste and place it in contact with the bottom of the contact terminal. At the melting temperature, the paste, which contains flux, melts. Molten solder assumes a shape by surface tension, thus the shape is a partially distorted sphere, the distortion of the sphere is the result of wetting of the contact end.

In the prior art, the "positioning" of the ball is made by means of the housing (other BGA connectors), or by making a small Dimple in the center of the pad. This invention provides a new, economical means of the ball positioning.

Figure 1:
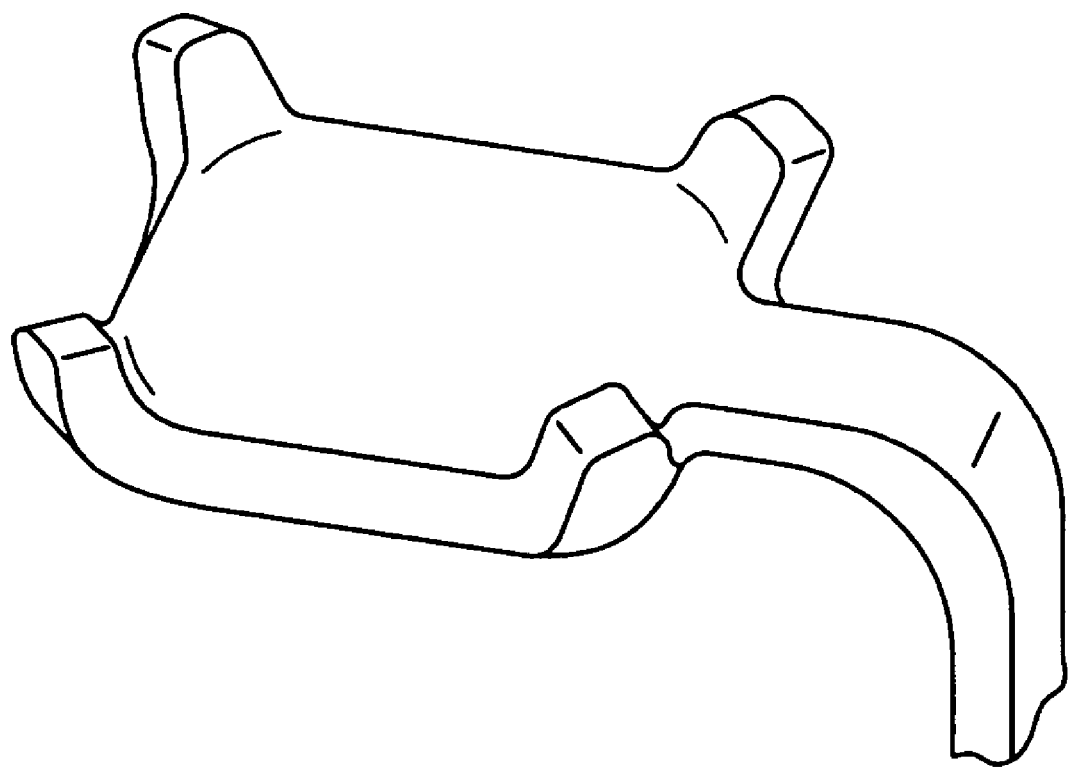
FIG. 1 depicts the platform or pad of a generally rectangular connector in which the four corners of the platform are bent at an angle to receive a ball of solder.
Figure 2:
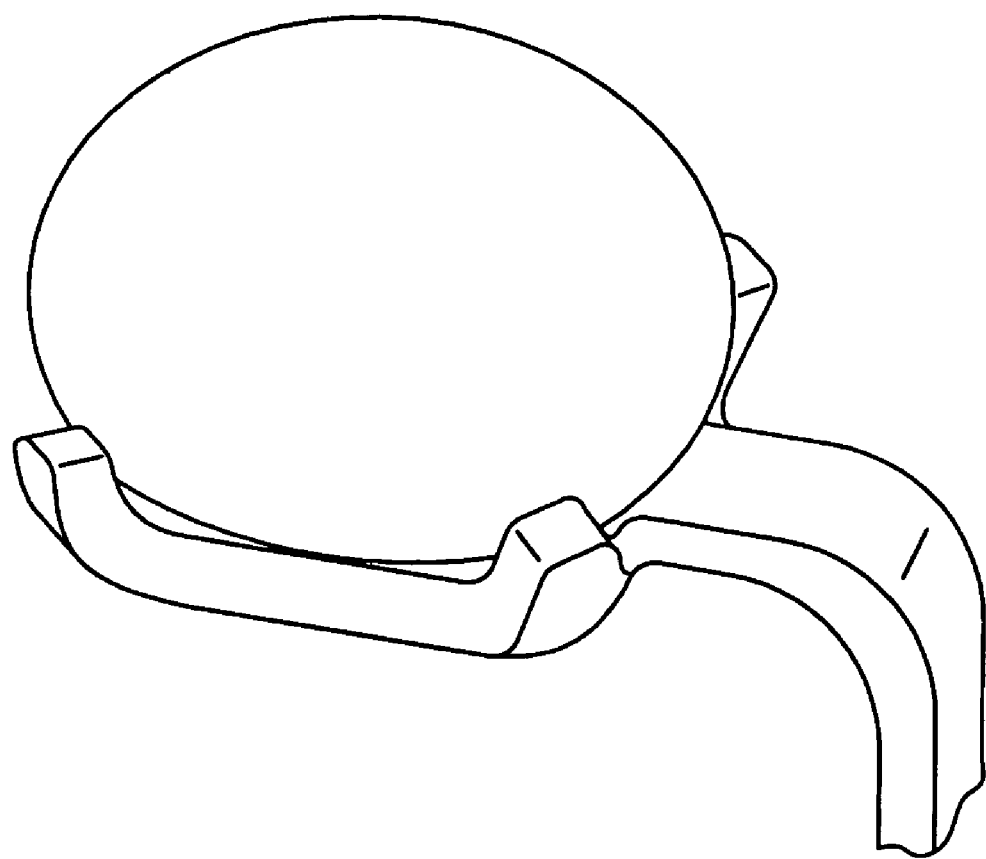
FIG. 2 depicts FIG. 1 with a solder ball attached to the platform from the top.
Figure 3:
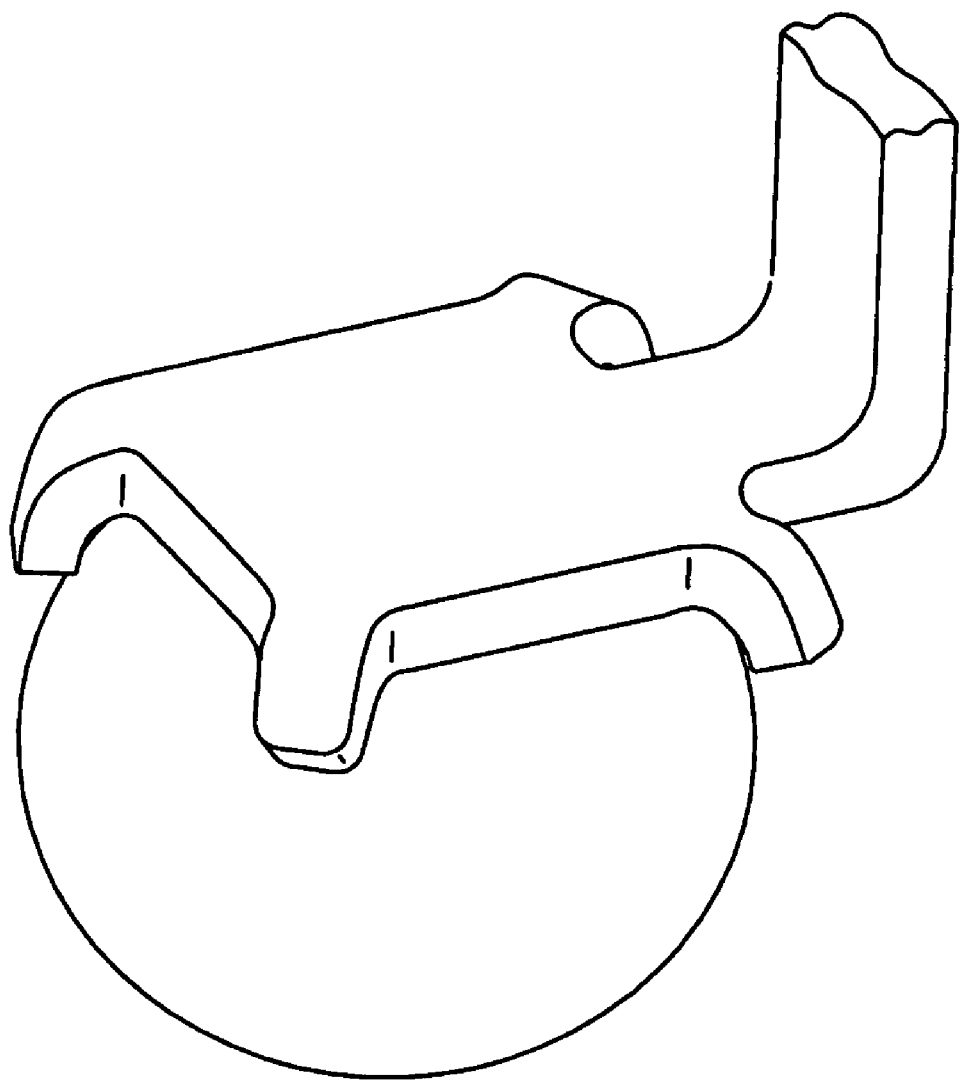
FIG. 3 depicts a view generally from the side and top of the platform with a solder ball attached thereto from the bottom.

Proposed herewith is a simple, economical structure and method of implementation, without increasing the material cost or the manufacturing cost. The method consists of bending the four corners of the Pad or Platform, whatever the choice of jargon words better applies. Such corners or "fingers", shaped so that their inner surface is made tangent to the ball, forming a nest, shall position the ball even more securely than the "dimple." The changes in the stamping tool can be implemented at a small cost. The new structure of the pad is illustrated in FIGS. 1, 2, and 3 depicting the pad and the pad with the ball in place. Most people are using a high melting point alloy for the ball, requiring the use of solder paste. Some people are using 60-40 alloy, which is the same as the usual paste alloy. With the proper flux the passive surface of nickel is made wettable with solder, thus, depending on the placement of flux either only the center of the pad, or the entire pad, including the bent-up corners shall be covered by solder. The finished geometry shall be a rectangular base with a spherical projection on top.

The implementing of this design has many additional advantages which should not be limited to any single embodiment, but rather construed in breadth and scope in accordance with the claims.

What is claimed is:

1. An electrical connector having a conductive contact comprising:
   an insulative housing adapted to engage the conductive contact, the conductive contact having a distal end wherein the distal end is angled and has a generally rectangular shape such that the four corners of the rectangular shape of the distal end are bent to adapt the distal end to receive a mass of fusible material.

2. The electrical connector of claim 1 wherein the conductive contact is made of copper alloy.

3. The electrical connector of claim 2 wherein the conductive contact is over-plated with nickel.

4. The electrical connector of claim 1 wherein the mass of the fusible material is generally ellipsoidal.

5. The electrical connector of claim 1 wherein the mass of the fusible material is generally spherical.

6. A product of a method for placing a fusible material on an electrical connector having a conductive contact comprising:
   providing an insulative housing adapted to engage the conductive contact,
   providing the conductive contact having a distal end wherein the distal end is angled and has a generally rectangular shape,
   bending the four corners of the rectangular shape of the distal end to adapt the distal end to receive a mass of fusible material.

7. The product of claim 6 wherein the conductive contact is made of a copper alloy.

8. The product of claim 7, wherein the conductive contact is over-plated with nickel.

9. The product of claim 6 wherein the mass of the fusible material is generally ellipsoidal.

10. The product of claim 6 wherein the mass of the fusible material if generally spherical.

11. A contact assembly for use with an electrical connector, comprising:
- a vertical section; and
- a horizontal section essentially extending at a bottom end of said vertical section and perpendicular to said vertical section, said horizontal section including a narrow strap portion connected to the vertical section and a large plate portion connected to said narrow strap portion, the large plate defining a plurality of sides and a plurality of corners thereof; wherein at least three bends extend downwardly from the corresponding corners of said large plate portion, respectively, and the narrow strap portion essentially extends from the corresponding one edge of said large plate portion and between two corresponding bends.

12. The contact as claimed in claim 11, wherein an interior face of each of said bends is curved to comply with a solder mass which has a flat top face seated upon the large plate portion, and a spherical peripheral potion compliantly grasped by all said bends.

* * * * *